US011791195B2

(12) United States Patent
Konta

(10) Patent No.: US 11,791,195 B2
(45) Date of Patent: Oct. 17, 2023

(54) SUBSTRATE PROCESSING APPARATUS

(71) Applicant: Tokyo Electron Limited, Tokyo (JP)

(72) Inventor: Yoshitomo Konta, Miyagi (JP)

(73) Assignee: Tokyo Electron Limited, Tokyo (JP)

(*) Notice: Subject to any disclaimer, the term of this patent is extended or adjusted under 35 U.S.C. 154(b) by 156 days.

(21) Appl. No.: 17/454,093

(22) Filed: Nov. 9, 2021

(65) Prior Publication Data

US 2022/0157642 A1     May 19, 2022

(30) Foreign Application Priority Data

Nov. 13, 2020   (JP) ................................ 2020-189135

(51) Int. Cl.
*H01L 21/687*     (2006.01)
*H01L 21/67*     (2006.01)

(52) U.S. Cl.
CPC .. *H01L 21/68742* (2013.01); *H01L 21/67196* (2013.01)

(58) Field of Classification Search
CPC ......... H01L 21/67196; H01L 21/68742; H01L 21/6719; H01L 21/67313; H01L 21/67757; H01L 21/67751
See application file for complete search history.

(56) References Cited

U.S. PATENT DOCUMENTS

2016/0307782 A1* 10/2016 Weaver ............. H01L 21/67742
2017/0186601 A1* 6/2017 Ikeda ................. H01L 21/02057

FOREIGN PATENT DOCUMENTS

JP     2017-017154     1/2017

* cited by examiner

*Primary Examiner* — Glenn F Myers
(74) *Attorney, Agent, or Firm* — IPUSA, PLLC

(57) ABSTRACT

A substrate processing apparatus includes a chamber and units disposed above or on the chamber, at least one unit including a first groove. The substrate processing apparatus includes a lifting mechanism including at least one second groove, the lifting mechanism being configured to raise and lower each of the units. The units are configured to be raised and lowered in a state of being secured to the lifting mechanism, upon occurrence of a condition in which a fixing member is inserted into the first groove of the at least one unit and the second groove of the lifting mechanism.

12 Claims, 10 Drawing Sheets

US 11,791,195 B2

SUBSTRATE PROCESSING APPARATUS

CROSS-REFERENCE TO RELATED APPLICATION

This patent application claims priority to Japanese Patent Application No. 2020-189135, filed Nov. 13, 2020, the contents of which are incorporated herein by reference in their entirety.

TECHNICAL FIELD

The present disclosure relates to a substrate processing apparatus.

BACKGROUND

Patent Document 1 discloses a semiconductor manufacturing apparatus that includes chambers, a vacuum transfer module, load lock modules, a loader module, load ports, and a controller. A wafer is transferred out of a given load port and then is transferred, via the loader module and a given load lock module, into at least one among the chambers by a transfer device. The transfer device is provided in the vacuum transfer module. The transferred wafer is processed.

CITATION LIST

Patent Document

Patent Document 1: Japanese Unexamined Patent Application Publication No. 2017-17154

SUMMARY

According to one aspect of the present disclosure, a substrate processing apparatus is provided. The substrate processing apparatus includes a chamber and units disposed above or on the chamber, at least one unit including a first groove. The substrate processing apparatus includes a lifting mechanism including at least one second groove, the lifting mechanism being configured to raise and lower each of the units. The units are configured to be raised and lowered in a state of being secured to the lifting mechanism, upon occurrence of a condition in which a fixing member is inserted into the first groove of the at least one unit and the second groove of the lifting mechanism.

DETAILED DESCRIPTION

One or more embodiments of the present disclosure will be described with reference to the drawings. Note that in each drawing, the same numerals denote the same components, and duplicate description for the components may be omitted.

[Substrate Processing Apparatus]

Figure 1A:
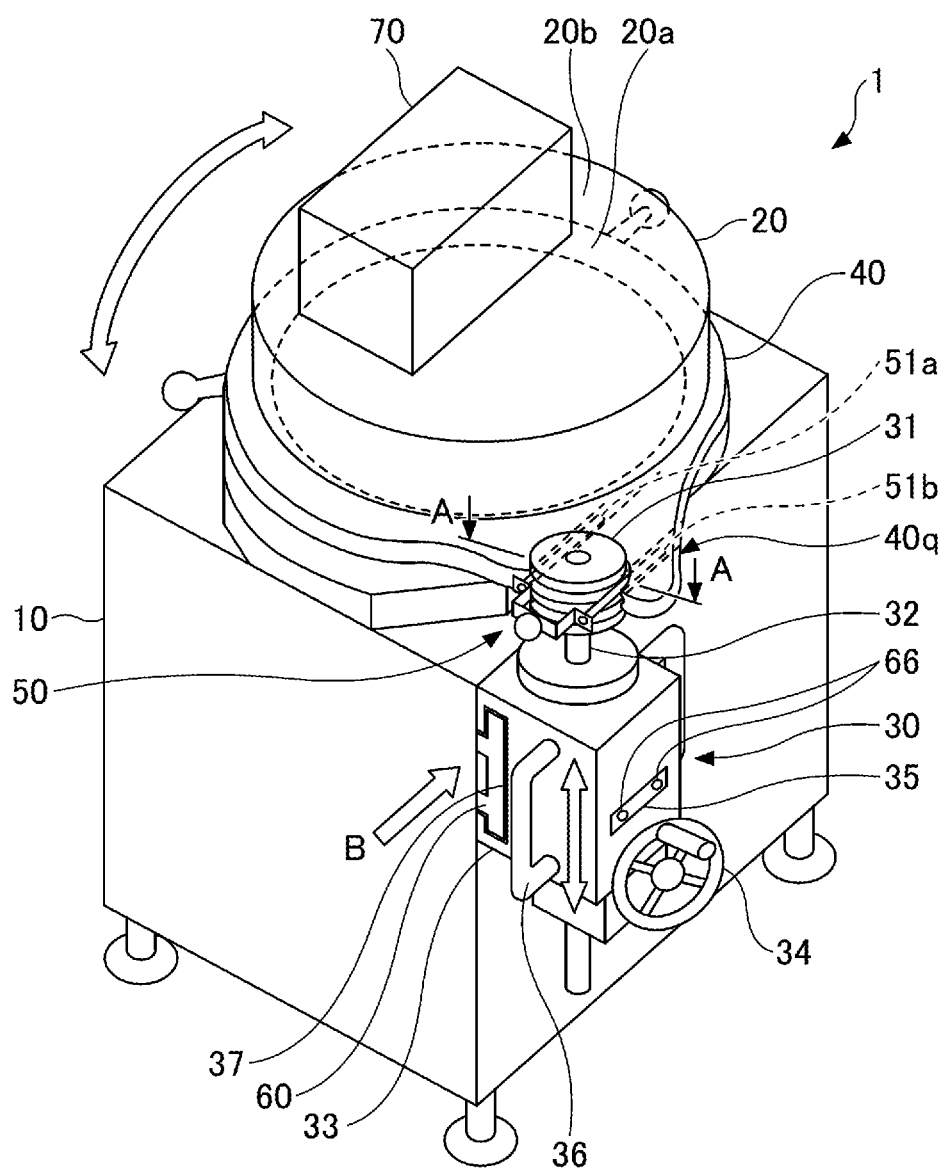
FIGS. 1A and 1B are diagrams illustrating an example of a substrate processing apparatus to which a lifting mechanism is removably connected according to one embodiment.
Figure 1B:
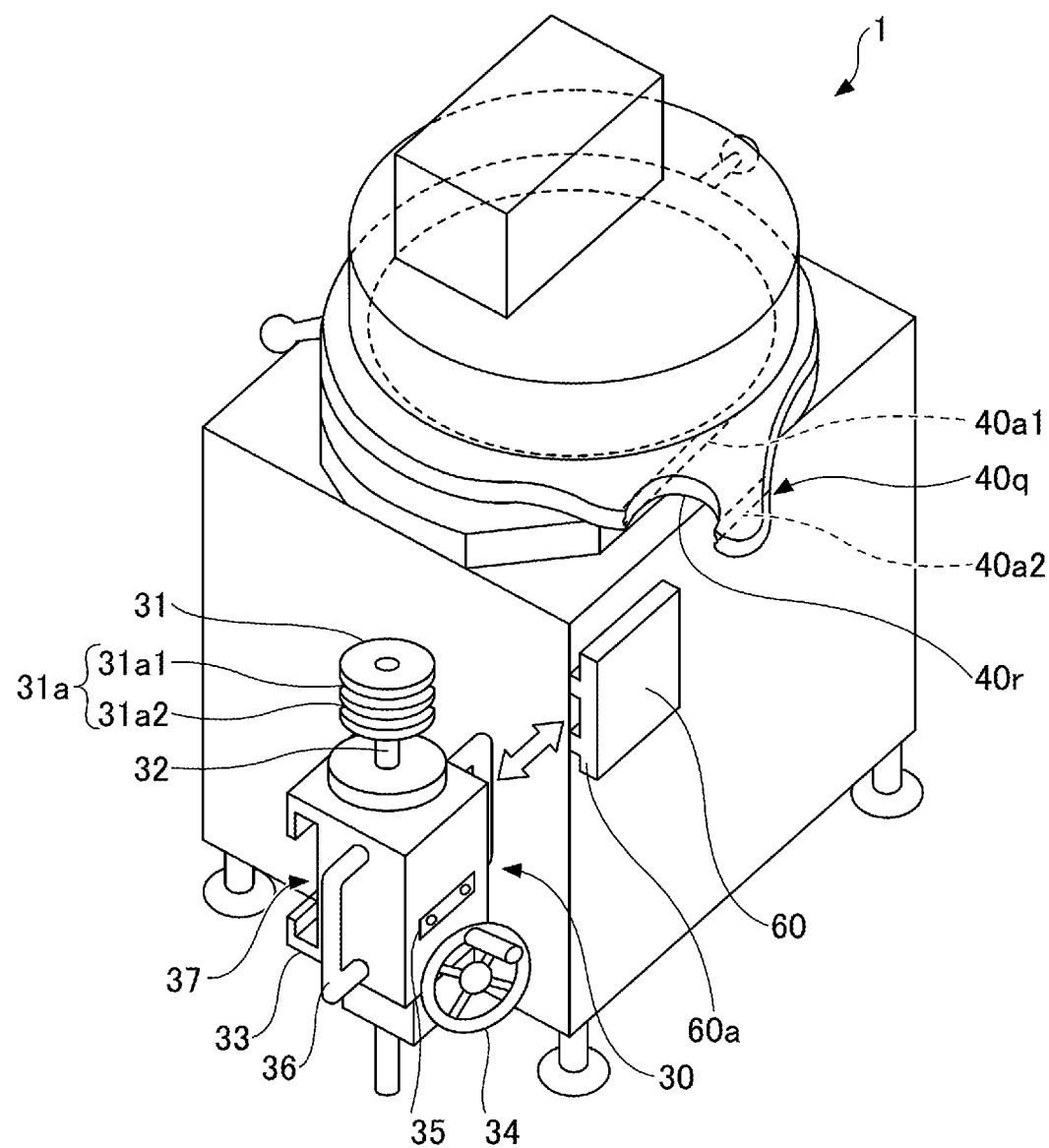

A substrate processing apparatus 1 according to one embodiment will be described with reference to FIGS. 1A and 1B. FIGS. 1A and 1B are diagrams illustrating an example of the substrate processing apparatus 1 according to one embodiment. FIG. 1A illustrates the substrate processing apparatus 1 to which the lifting mechanism 30 is removably connected. FIG. 1B illustrates the substrate processing apparatus 1 from which the lifting mechanism 30 is disconnected.

As illustrated in FIG. 1A, the substrate processing apparatus 1 includes a chamber 10. A contour of the chamber 10 is rectangular, and an interior of the chamber 10 is approximately cylindrical. The chamber 10 has an inner space. An upper side of the chamber 10 is open. The chamber 10 is formed of aluminum, for example. A substrate supporting portion (not illustrated) to support a substrate is provided in the chamber 10. The chamber 10 is grounded.

An upper unit 20 is provided above the substrate supporting portion. The upper unit 20 closes an opening of the chamber 10 at the upper portion thereof. Thus, the inner space of the chamber 10 is kept airtight.

The upper unit 20 may include a top plate and a support. A top surface of the top plate is supported by the support. An upper unit 20a may be the top plate, an upper electrode, a showerhead, or an antenna. An upper unit 20b may be the support. A bottom surface of the top plate is a surface of the chamber 10 toward the inner space, and defines the inner space. The top plate has gas holes (not illustrated), and the gas holes are provided through the top plate in a thickness direction thereof. The top plate may be connected to a gas supply line above the support, where the gas supply line is connected to a gas supply.

The support removably supports the top plate. The support is formed of an electrically conductive material such as aluminum. A gas path communicating with the gas holes, which are provided in the top plate, is formed in an interior of the support.

In the substrate processing apparatus 1, gas is supplied to the inner space of the chamber 10 through the gas supply line and gas holes. The substrate is appropriately processed with the gas. Radio frequency (RF) power at an appropriate radio frequency is applied to the substrate supporting portion or the upper unit 20 to thereby produce a plasma from the gas, and then the substrate may be processed with the plasma.

The upper units 20a and 20b are examples of units disposed above the chamber 10. The units disposed above the chamber 10 may include any components above the chamber 10. The components may include components such as the upper unit 20 and a device 70 disposed on the upper unit 20. The units described above may include a DC power source (not illustrated), an RF power source (not illustrated), and a matching device (not illustrated), where DC power unit, the RF power unit and the matching device are each coupled to the upper unit 20. The DC power source may apply, to the upper unit 20, a negative voltage for drawing positive ions existing at the inner space of the chamber 10.

An exhaust port (not illustrated) is provided at the bottom of the chamber 10 and an exhausting device (not illustrated) is attached to the exhaust port. The exhausting device includes a pressure regulating valve and a vacuum pump such as a turbomolecular pump.

The substrate processing apparatus 1 may further include a controller (not illustrated). The controller may be implemented by a computer that includes a CPU, a storage, an input device, a display device, an interface for inputting and outputting signals, and the like. The controller may control each component of the substrate processing apparatus 1. A control program and recipe data are stored in the storage. The computer retrieves the control program from the storage to thereby execute the control program, and may control each component of the substrate processing apparatus 1 based on the recipe data.

As illustrated in FIG. 1B, an attachment portion 60 is provided on an outside wall of the substrate processing apparatus 1. The attachment portion 60 includes a plate-like member 60a and protruding portions each protruding from the plate-like member 60a. The attachment portion 60 is secured to the substrate processing apparatus 1 through the protruding portions. The plate-like member 60a removably supports the lifting mechanism 30.

The lifting mechanism 30 is removably connected to the substrate processing apparatus 1 so as to raise and lower each of the upper unit 20 and the device 70. The lifting mechanism 30 includes a lift jig 31, a shaft 32, a main body 33, a handle 34, a rattle suppressing portion 35, and a handle 36. The lift jig 31 has a disk-like shape in a plan view and is provided at a top end of the lifting mechanism 30. Grooves (hereafter referred to as "lifting mechanism-side grooves") are formed on the side surface of the lifting jig 31 in a circumferential direction thereof. In the example in FIG. 1B, two lifting mechanism-side grooves 31a1 and 31a2, which are arranged one above the other, are formed on the entire circumference of the side surface of the lifting jig 31. The lifting mechanism-side grooves 31a1 and 31a2 may be collectively referred to as lifting mechanism-side grooves 31a. In this example, the lifting mechanism-side groove 31a is formed on the entire circumference of the side surface of the lifting jig 31. However, there is no limitation to the lifting mechanism-side grooves 31a, and the lifting mechanism-side grooves 31a may be each formed on the side surface of the lifting jig 31 so as to have an arc shape. The number of lifting mechanism-side grooves 31a formed on the lifting jig 31 may be one or more.

The shaft 32 is a rod-like member. The shaft 32 secures the lift jig 31 at the top side of the shaft, passes through a through-hole provided vertically in the main body 33, and is rotatably provided with respect to the main body 33. The handle 34 is attached to the outer wall of the main body 33. The lifting mechanism 30 is configured to be driven by manually rotating the handle 34.

A portion of a rotation shaft of the handle 34 has a gear structure having teeth or the like, and the gear structure on the rotation shaft engages with one or more other gear structures. Thus, a rotational motion of the handle 34 is transmitted to the shaft 32 through one or more gear structures. With this arrangement, when the handle 34 is manually rotated, the rotational motion of the handle 34 is transmitted to the shaft 32 through the one or more gear structures, and thus the lifting jig 31 is raised and lowered together with the shaft 32.

Figure 2:
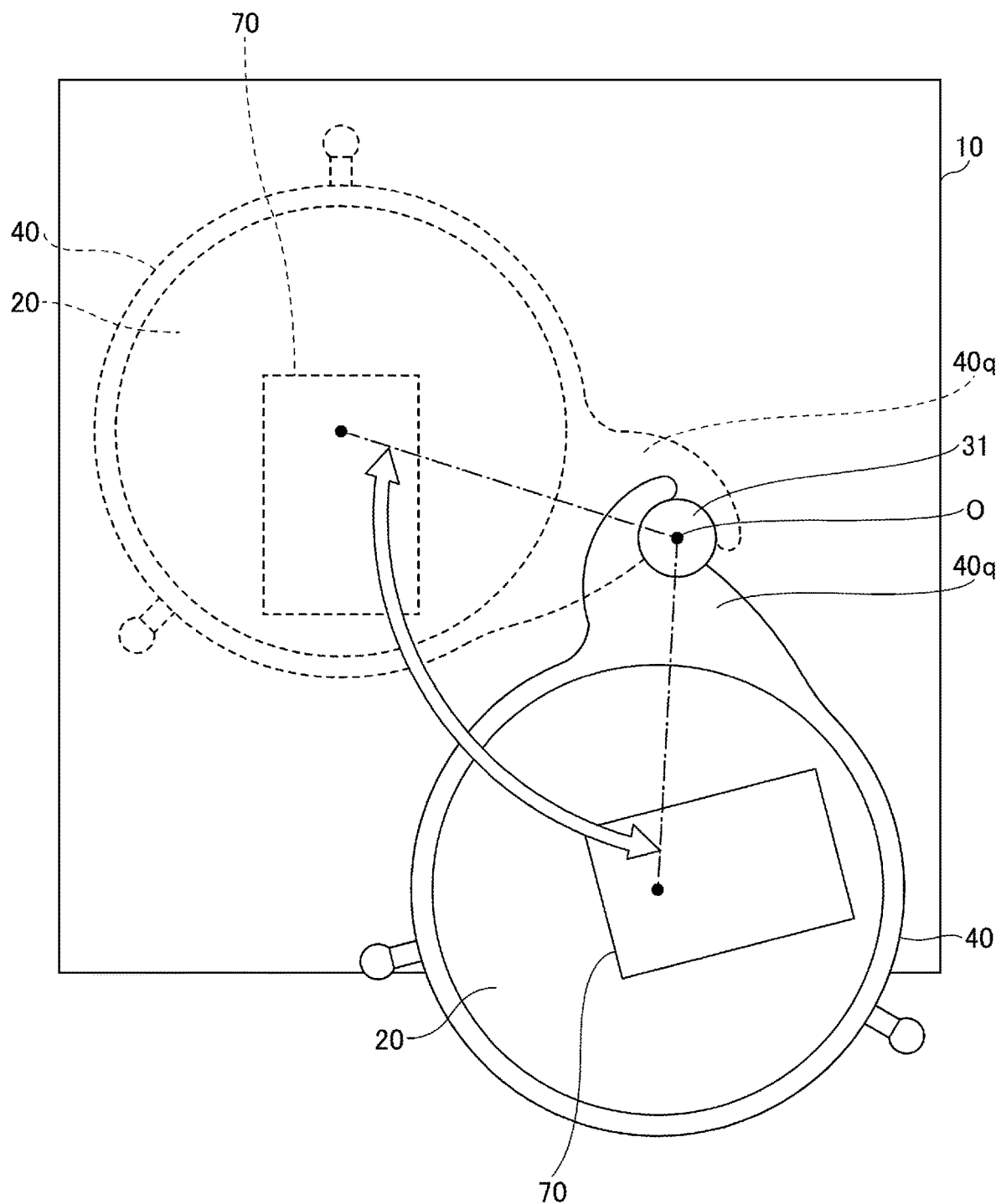
FIG. 2 is a plan view of an example of the substrate processing apparatus according to one embodiment.

A coupling member 40 is secured to the lifting jig 31 by a power transmission switching mechanism of the lifting mechanism 30, which will be described later. Any one of the units described above may be the coupling member 40. FIG. 2 is a plan view of the substrate processing apparatus 1 according to one embodiment. As illustrated in FIG. 2, the coupling member 40 surrounds the upper unit 20 and has an annular frame that holds the upper unit 20, in a state in which the device 70 is stacked on the upper unit 20.

The coupling member 40 also has an arm 40q coupled to the frame. A cut-out portion 40r is formed in the arm 40q so as to be shaped in an approximate arc. The lifting jig 31, which is provided at the top end of the lifting mechanism 30, is disposed at the cut-out portion 40r. The lifting jig 31 is raised by power of the lifting mechanism 30, and thus the upper unit 20 and the device 70 are raised from the chamber 10, together with the coupling member 40 secured to the lifting jig 31.

In a state in which the upper unit 20 and the device 70 are raised up to a predetermined height, the coupling member 40 is rotated about a central axis O of the lifting jig 31, as expressed by a given arrow in FIG. 2. With this arrangement, the upper side of the chamber 10 is open, thereby allowing maintenance of the chamber 10. When the maintenance is completed, the lifting mechanism 30 is operated by a reverse procedure and then the upper unit 20 and the device 70 are again disposed above the chamber 10.

As illustrated in FIG. 1B, a recessed portion 37 for attaching the lifting mechanism 30 to the attachment portion 60 is formed on one side surface of the main body 33 such that the lifting mechanism 30 can slide with respect to the attachment portion 60, where the attachment portion 60 is used as a base. When viewed in the direction B illustrated in FIG. 1A, a slightly large space is defined with the recessed portion 37, in comparison to a space equivalent to the side shape of the plate-like member 60a. The main body 33 has respective hook-like portions at upper and lower ends of the recessed portion 37. The hook-like portion of the recessed portion 37 at the upper end extends downward, and the hook-like portion of the recessed portion 37 at the lower end extends upward.

When mounted, a detached lifting mechanism 30, as illustrated in FIG. 1B, is moved in the direction B illustrated in FIG. 1A, and subsequently the main body 33 is attached to the attachment portion 60 such that the plate-like member 60a of the attachment portion 60 fits in the space of the recessed portion 37. Then, the lifting mechanism 30 is slid laterally using the handle 36. With this arrangement, the lifting mechanism 30 can be attached to the substrate processing apparatus 1. As one example of sliding the lifting mechanism 30 laterally, an approach to provide a sliding mechanism, such as a rail or a ball bearing, at the recessed portion 37 of the lifting mechanism 30 may be adopted. However, a method of sliding the lifting mechanism 30 is not limiting.

[Screw Operation]

Figure 3A:
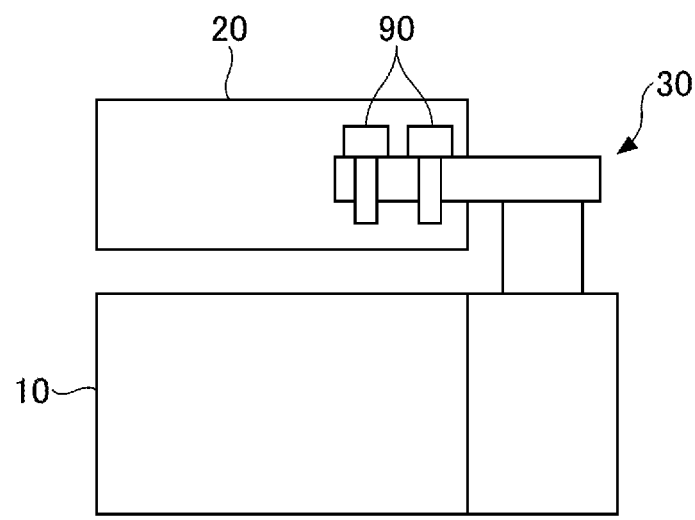
FIGS. 3A to 3C are diagrams for describing a conventional lifting mechanism.
Figure 3B:
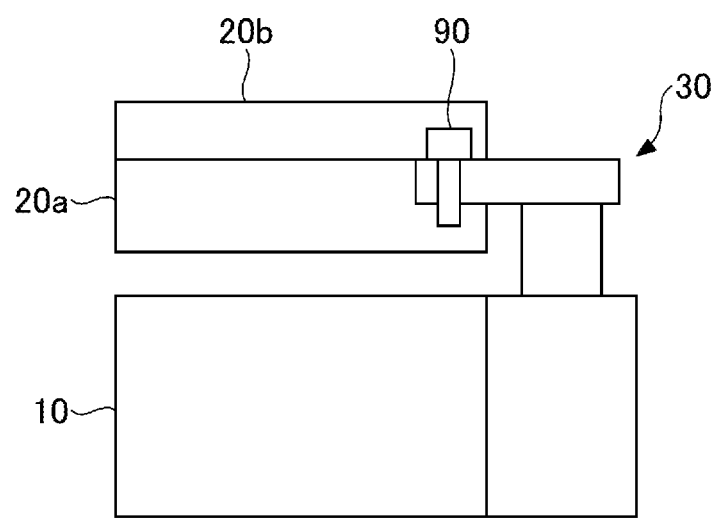
Figure 3C:
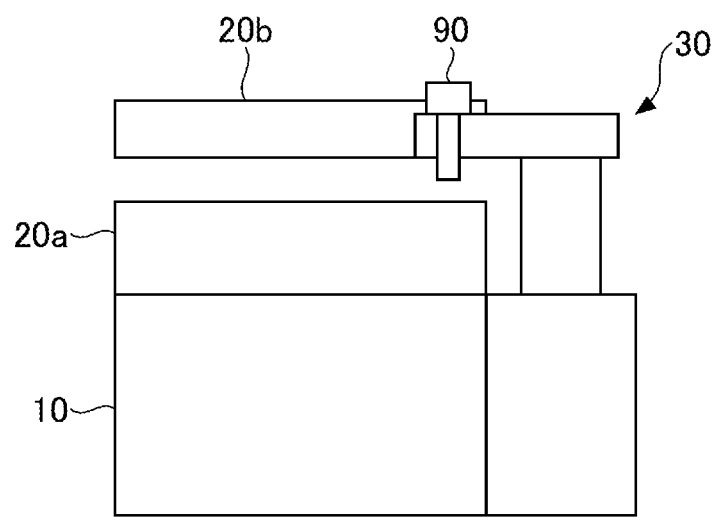

A conventional lifting mechanism 30 will be described with reference to FIGS. 3A to 3C. FIGS. 3A to 3C are diagrams for describing the conventional lifting mechanism 30. As illustrated in FIG. 3A, in the conventional lifting mechanism 30, screws 90 are used to secure the upper unit 20 to the lifting mechanism 30. In such a screw operation, the screws 90 need to be loosened in order to remove the lifting mechanism 30 from the upper unit 20, and consequently the lifting mechanism 30 may not be easily attached to or removed from the upper unit 20. In some cases, the position of the lifting mechanism 30 could not be changed. The screw operation to be performed during maintenance is troublesome. Therefore, there is demand for more simple operations to be performed.

Also, in a case (FIG. 3B) in which maintenance is performed by raising and lowering an upper unit 20*a* of a two-stage upper unit 20, as well as in a case (FIG. 3C) in which maintenance is performed by raising and lowering an upper unit 20*b* of the two-stage upper unit 20, a driven position of the screw 90 is changed by taking into account a target unit of the upper unit 20 to be raised or lowered. Specifically, the screw 90 needs to change from a state illustrated in FIG. 3B to a state illustrated in FIG. 3C. In other words, after the upper unit 20*b* is secured to the lifting mechanism 30 with the screw 90, the upper unit 20*b* is removed from the upper unit 20*a* in order to perform maintenance of the upper unit 20*a*. Even in such a case, a troublesome screw operation may need to be performed. Thus, there is demand for maintenance to be performed more simply.

Figure 4:
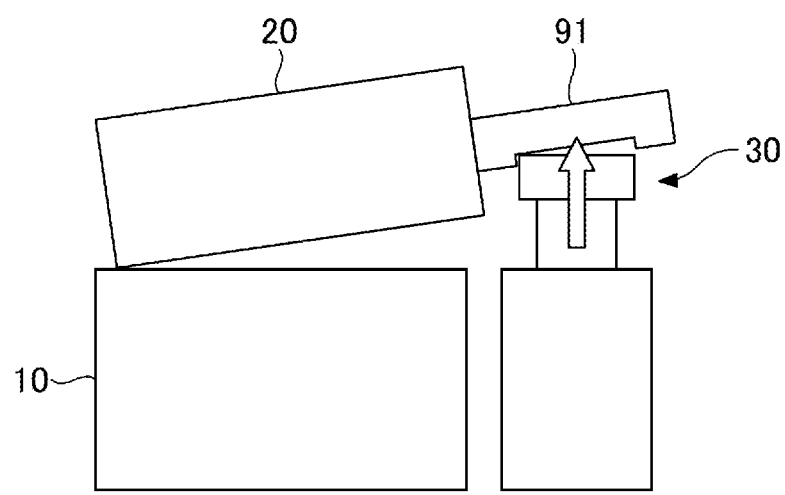
FIG. 4 is a diagram for describing situations of a lifting mechanism in the related art.

Furthermore, in FIG. 4, in order to perform maintenance of the chamber 10, another method of raising and lowering the upper unit 20 is conceivable. In such a method, a cut-out portion or a hole is provided at a connection portion 91 for connecting the upper unit 20 to the lifting mechanism 30, and the upper unit 20 is raised and lowered in a state in which the upper unit 20 is supported with the cut-out portion or hole. However, in such a method, even if the lifting mechanism 30 is engaged with the connection portion 91 at an inappropriate position, the upper unit 20 is still raised by the lifting mechanism 30, and consequently the upper unit 20 might not be secured to the connection portion 91. Thus, there is risk of the upper unit 20 raised by the lifting mechanism 30 falling off or anything of the sort.

Due to a longer life or the like of components, the number of times the upper side of the chamber 10 is opened for maintenance has been reduced. Thus, it is desirable to remove a mechanism for introducing compressed air to be used in the lifting mechanism 30, as well as other electrical components, to the extent possible. In order to open the upper side of the chamber 10, if compressed air or electricity is used for moving the upper unit 20, faulty insulation, an electric shock, or the like might occur during attachment or removal of the lifting mechanism 30.

Therefore, according to the present embodiment, in the lifting mechanism 30 illustrated in FIG. 1, with use of the power transmission switching mechanism, a jack is operated manually, without using any compressed air or electricity. With this arrangement, the lifting mechanism 30 that can be safely and simply attached to or removed from the upper unit 20 or the like is provided without occurrence of faulty insulation, an electric shock, or the like during power interruption. Accordingly, maintenance of the chamber 10 can be performed safely and simply.

[Power Transmission Switching Mechanism of Lifting Mechanism]

Figure 5:
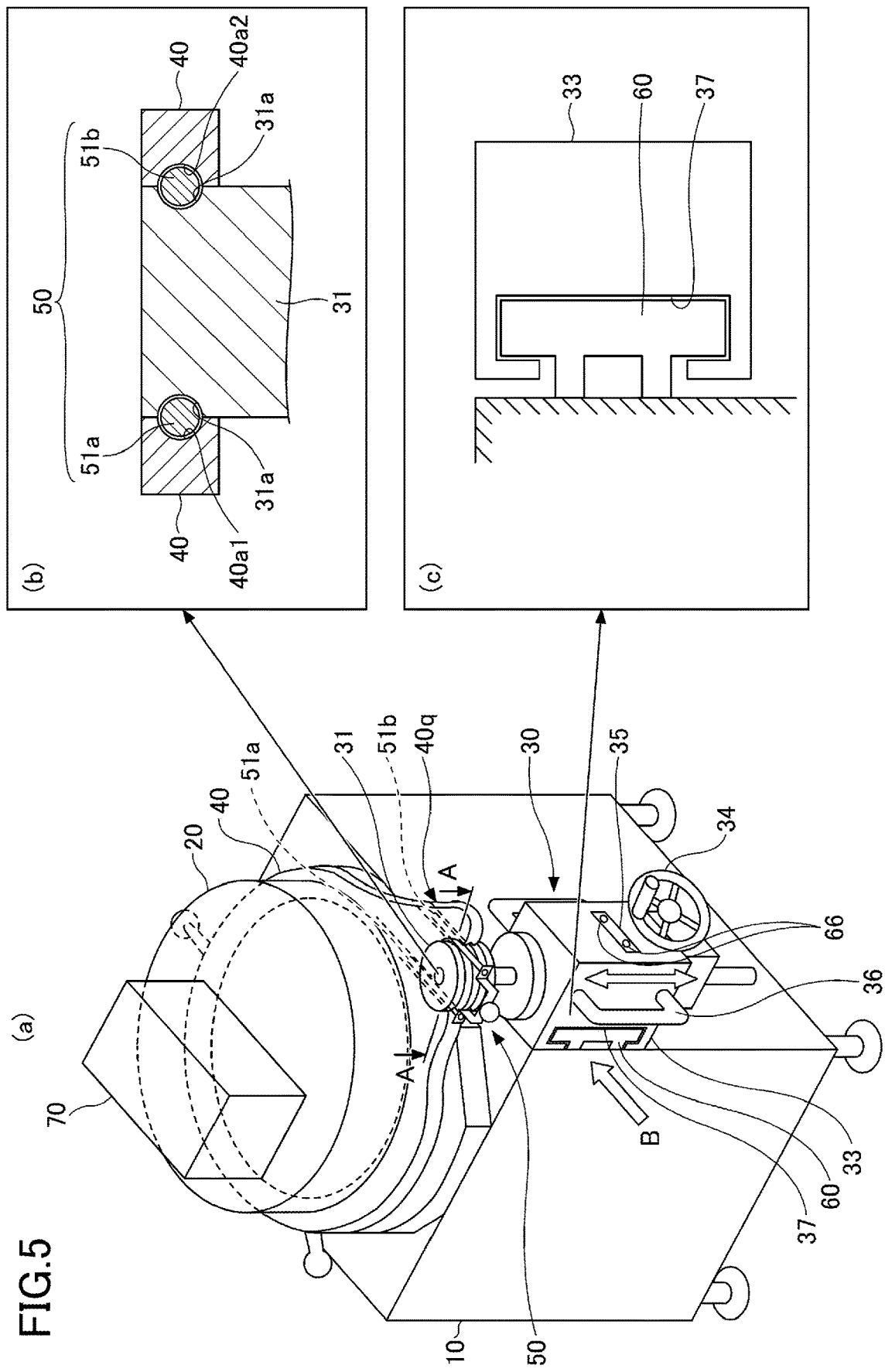
FIG. 5 is a diagram illustrating the substrate processing apparatus to which the lifting mechanism is removably connected according to one embodiment.
Figure 6:
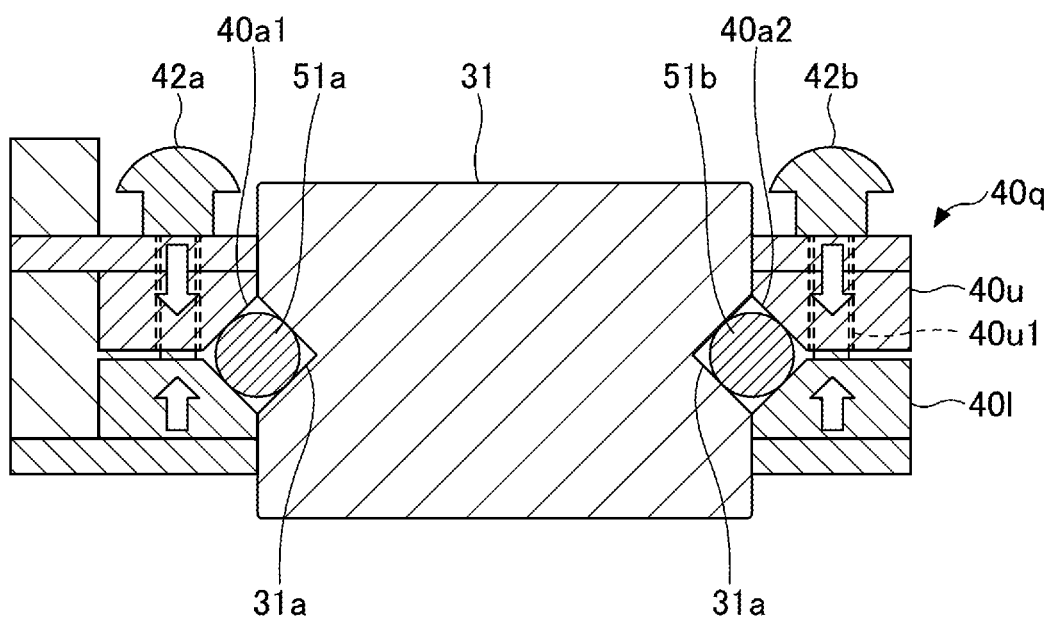
FIG. 6 is a cross-sectional view of a power transmission switching mechanism of the lifting mechanism taken along the A-A in FIG. 1.

Hereafter, the power transmission switching mechanism of the lifting mechanism 30 according to the present embodiment will be described with reference to FIGS. 1, 5, and 6. (a) of FIG. 5 illustrates an example of the substrate processing apparatus 1 removably connected to the lifting mechanism 30 according to the present embodiment. (b) of FIG. 5 is a cross-sectional view of an example of the lifting mechanism 30 taken along the A-A line illustrated in (a) of FIG. 5. (c) of FIG. 5 is a side view of the attachment portion 60 to which the lifting mechanism 30 is attached, when the attachment portion 60 is viewed in the direction B illustrated in (a) of FIG. 5. FIG. 6 is a cross-sectional view of an example of the power transmission switching mechanism of the lifting mechanism 30 taken along the A-A line in (a) of FIG. 5.

As illustrated in FIG. 5(*b*), two grooves are formed with respect to two side surfaces of the arc-shaped cut-out portion 40*r* (see FIG. 1B) provided in an arm 40*q*. The two grooves are referred to as the unit-side grooves 40*a*1 and 40*a*2. The unit-side grooves 40*a*1 and 40*a*2 are linearly formed in parallel and pass through the arm 40*q*. However, the unit-side grooves 40*a*1 and 40*a*2 may be shaped in an arc along the cut-out portion 40*r*. The unit-side grooves 40*a*1 and 40*a*2 may be coupled to each other inside the arm 40*q*, or may not be coupled to each other.

In (b) of FIG. 5 illustrating a schematic cross-section of the lifting jig 31, the coupling member 40, and the like taken along the A-A line in (a) of FIG. 5, the unit-side groove 40*a*1 and one lifting mechanism-side groove 31*a* face each other to constitute a receptacle, and the unit-side groove 40*a*2 and another lifting mechanism-side groove 31*a* face each other to constitute a receptacle. A given groove among the unit-side groove 40*a*1 and 40*a*2 and a given lifting mechanism-side groove 31*a* are approximately symmetrical with respect to a boundary line determined based on the given unit-side groove and the given lifting mechanism-side groove 31*a*. In the example in (b) of FIG. 5, a cross-sectional shape of each receptacle is circular, and a cross-sectional shape of each of the unit-side grooves 40*a*1 and 40*a*2 and the lifting mechanism-side grooves 31*a* is semi-circular. Two key shafts 51*a* and 51*b* provided in the fixing member 50, as illustrated in (b) of FIG. 5, are inserted into the respective receptacles. The key shafts 51*a* and 51*b* are deeply inserted into the respective receptacles, and thus the lifting mechanism 30 can be secured to the coupling member 40 safely and simply.

In such a configuration, unless a given groove among the unit-side grooves 40*a*1 and 40*a*2 and a given groove among the lifting mechanism-side grooves 31*a* are disposed facing each other at appropriate locations, a given shaft among the key shafts 51*a* and 51*b* cannot be sufficiently inserted from a corresponding receptacle to the innermost portion of a corresponding groove. In other words, the upper unit 20 cannot be raised if the lifting mechanism 30 is secured to the coupling member 40 at an inappropriate position. Thus, there is no risk of the upper unit 20 falling off or anything of the sort. The upper unit 20 can be easily raised and lowered by power of the lifting mechanism 30, while ensuring safety during maintenance.

The key shafts 51*a* and 51*b* are rod-like members each having a circular shape in cross section. When a cross-sectional shape of each receptacle that is formed using a given groove among the unit-side grooves 40*a*1 and 40*a*2 and a given lifting mechanism-side groove 31*a* is circular, the key shafts 51*a* and 51*b* are each in contact with the coupling member 40 and the lifting jig 31. In this case, rattling might occur. As a result, the lifting mechanism 30 might not be secured sufficiently to the coupling member 40.

In view of the situation described above, as illustrated in FIG. 6, it is more preferable that the cross-sectional shape of the receptacle formed using a given groove among the unit-side grooves 40*a*1 and 40*a*2 and a given lifting mechanism-side groove 31*a* is a diamond shape. With this arrangement, the key shafts 51*a* and 51*b* inserted into respective receptacles are each in contact with the coupling member 40 and the lifting jig 31 so as to have a larger contact area. Thus, without occurrence of any rattling, the key shafts 51*a* and 51*b* can sufficiently secure the coupling member 40 and the lifting mechanism 30. The cross-sectional shape of each receptacle is not intended to being a perfect diamond shape. When the cross-sectional shape of a receptacle is a diamond shape defined by four sides consisting of two pairs of parallel sides, four tops may be either roundish or flat.

In the substrate processing apparatus 1 according to the present embodiment, the key shaft 51*a* of the fixing member 50 are inserted into the unit-side groove 40*a*1 and a given lifting mechanism-side groove 31*a*, and further, the key shaft 51*b* of the fixing member 50 are inserted into the unit-side groove 40*a*2 and a given lifting mechanism-side groove 31*a*. With this arrangement, multiple units such as the device 70 and the upper unit 20 are secured to the lifting mechanism 30 so as to be raised and lowered. In such a manner, the lifting mechanism 30 adjusts the height of the lifting jig 31 such that the unit-side grooves 40*a*1 and 40*a*2 and the lifting mechanism-side grooves 31*a* are each positioned appropriately, and subsequently the key shafts 51*a* and 51*b* of the fixing member 50 are respectively inserted into the receptacles. Thus, the lifting mechanism 30 can transmit power to the units such as the upper unit 20, thereby enabling the units to be raised and lowered. The number of receptacles for key shafts provided in the fixing member 50 is not limited to two, and may be one, or three or more.

As illustrated in FIG. 6, the coupling member 40 may have bolts 42*a* and 42*b* to be driven into the respective unit-side grooves 40*a*1 and 40*a*2. The bolts 42*a* and 42*b* are respectively provided proximal to the unit-side grooves 40*a*1 and 40*a*2. Multiple bolts 42*a* may be provided along the unit-side groove 40*a*1, and multiple bolts 42*b* may be provided along the unit-side groove 40*a*2.

When each of the bolts 42*a* and 42*b* is driven into the arm 40*q* of the coupling member 40, the arm 40*q* has an upper arm portion 40*u* and a lower arm portion 40*l*, a given bolt among the bolts 42*a* and 42*b* passes through a through-hole 40*u*1 in the upper arm portion 40*u* and then is secured to the lower arm portion 40*l*. By providing a bevel on an edge of each of the upper arm portion 40*u* and the lower arm portion 40*l*, an approximately half portion of the receptacle is formed.

The key shafts 51*a* and 51*b* of the fixing member 50 are respectively inserted into the receptacles that are each formed using a given groove among the unit-side grooves 40*a*1 and 40*a*2 and a given lifting mechanism-side groove 31*a*. Subsequently, heads of the bolts 42*a* and 42*b* are rotated such that the lower arm portion 40*l* fastened by the bolts 42*a* and 42*b* moves upward. The upper arm portion 40*u* is loaded downwardly by weight of the coupling member 40 and the upper unit 20. With this arrangement, the unit-side grooves 40*a*1 and 40*a*2 are each tightened vertically by a compressive force (a force to sandwich a given unit-side groove), and thus the key shafts 51*a* and 51*b* can be secured more strongly and vertically.

The bolts 42*a* and 42*b* may be provided with respect to the lifting jig 31, or may be provided with respect to each of the coupling member 40 and the lifting jig 31. When the bolts 42*a* and 42*b* are provided with respect to the lifting jig 31, the lifting jig 31 has an upper member and lower member, with respect to an approximate center of the lifting mechanism-side groove 31*a*, as in the coupling member 40.

[Rattle Suppressing Portion]

Figure 7A:
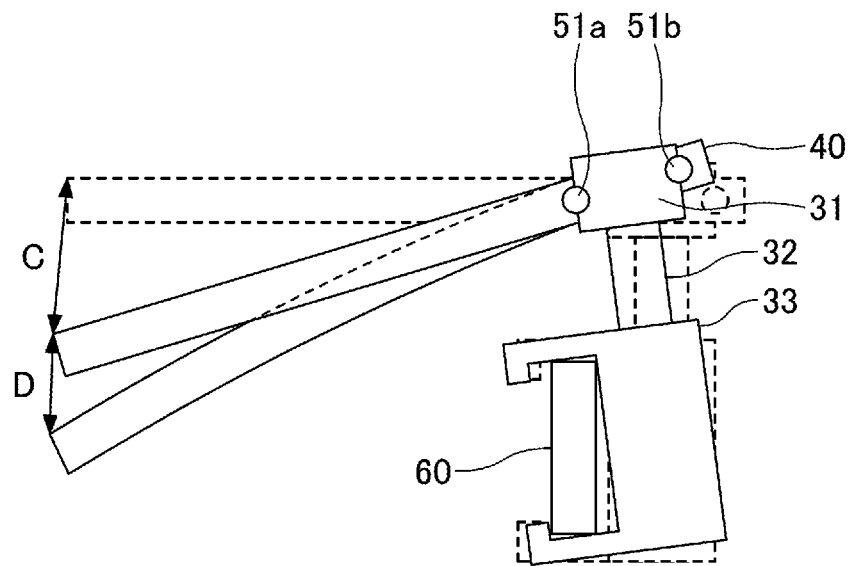
FIGS. 7A and 7B are cross-sectional views of an attachment portion of the lifting mechanism according to one embodiment.
Figure 7B:
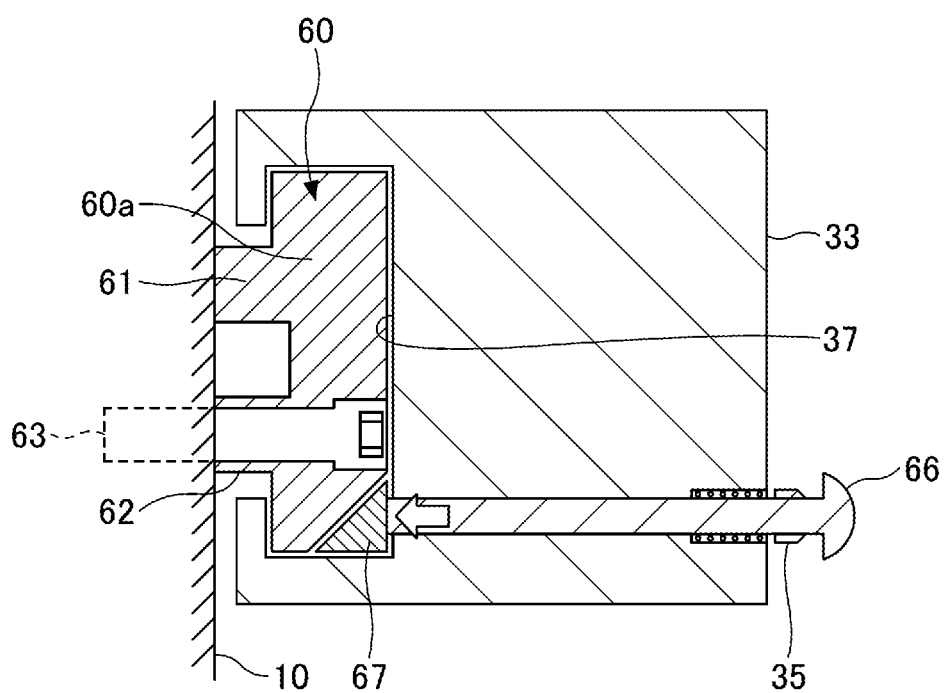

Hereafter, attachment of the main body 33 of the lifting mechanism 30, as well as the configuration of the rattle suppressing portion 35, will be described with reference to FIGS. 7A and 7B. FIGS. 7A and 7B are cross-sectional views of the lifting mechanism 30 and the attachment portion 60 according to one embodiment.

The lifting mechanism 30 is moved in the direction B illustrated in FIG. 5(*a*) to thereby attach the main body 33 of the lifting mechanism 30 to the attachment portion 60 from a lateral direction of the attachment portion, as illustrated in FIG. 5(*c*). As illustrated in FIG. 5(*a*), the lifting mechanism 30 is slid laterally by using the handle 36. With this arrangement, the lifting mechanism 30 is removably attached to the substrate processing apparatus 1.

Referring to FIG. 7B illustrating the attachment portion 60 in more detail, ends of two protruding portions 61 and 62 each protruding from the plate-like member 60*a* of the attachment portion 60 are secured to the outer wall of the substrate processing apparatus 1. A screw 63 is inserted into a through-hole through the plate-like member 60*a* and the protruding portion 62, and further is inserted into a hole formed in the outer wall of the chamber 10, thereby screwing the attachment portion 60 into the outside wall of the chamber 10.

Unfortunately, as illustrated in FIG. 7A, when the upper unit 20 or the like is raised, due to weight C or flexure D of the coupling member 40 at a distal end thereof, rattling might be caused between the main body 33 of the lifting mechanism 30 and the attachment portion 60.

In view of the situation described above, the lifting mechanism 30 according to the present embodiment includes the rattle suppressing portion 35. The rattle suppressing portion 35 has one or more bolts 66. As illustrated in FIG. 5(*a*), a given bolt 66 is driven from a surface of the main body 33 opposite the recessed portion 37 and is fastened with the rattle suppressing portion 35. Bolts 66 are provided, but the number of bolts 66 may be one. Referring now to FIG. 5(*c*) and FIG. 7B, a member 67 of which a cross-sectional shape is triangular is disposed at a location at which the member 67 contacts a top end of each bolt 66, so as to be arranged at a back corner of the bottom of the recessed portion 37. More specifically, the plate-like member 60*a* is bevel at the lower end thereof, and the member 67 of which the cross-sectional shape is triangular is disposed at the bevel portion of the plate-like member 60*a*. Each bolt 66 is inserted into a through-hole through a surface of the main body 33 opposite the recessed portion 37. A screw groove is provided at the through-hole. The screw groove engages with a given bolt 66, a head of the given bolt 66 is rotated so that a distal end of the bolt 66 presses the member 67. With this arrangement, the plate-like member 60*a* is pressed vertically and laterally at the recessed portion 37, and thus is pressed against the inner wall of the recessed portion 37. Thus, rattling in the attachment portion 60 can be suppressed.

[Another Example of Power Transmission Switching Mechanism of Lifting Mechanism]

Figure 8A:
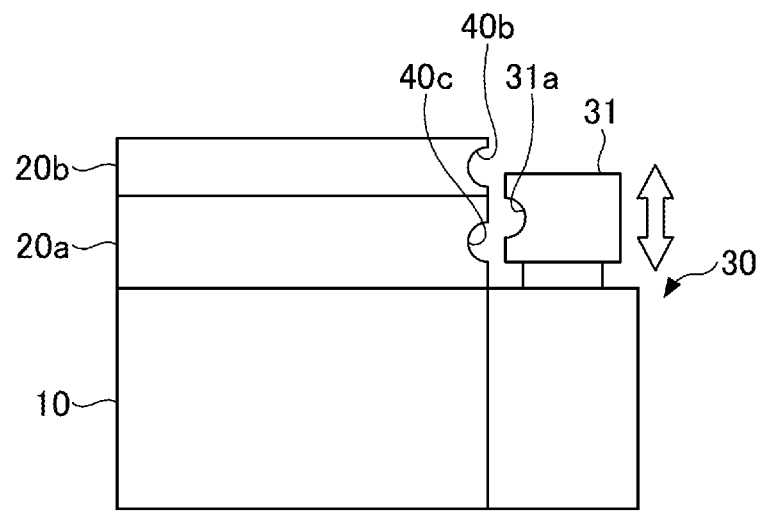
FIGS. 8A and 8B are diagrams illustrating another example of the power transmission switching mechanism of the lifting mechanism according to one embodiment.
Figure 8B:
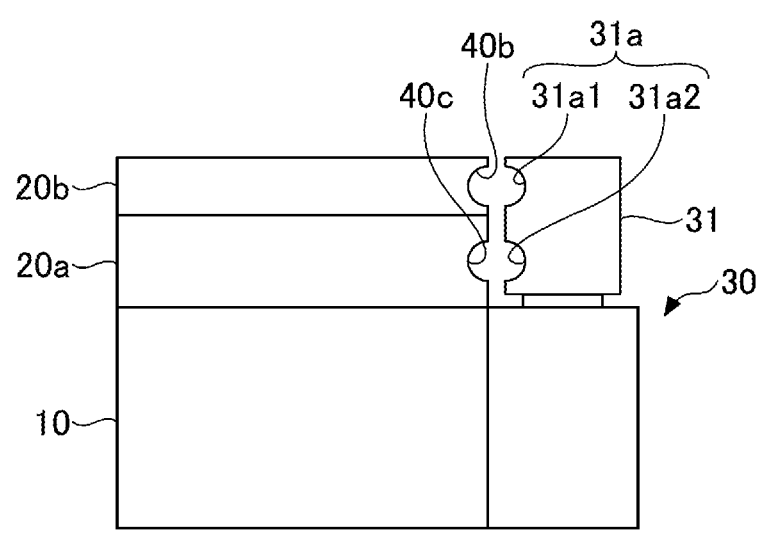

Another example of the power transmission switching mechanism of the lifting mechanism 30 will be described with reference to FIGS. 8A and 8B. FIGS. 8A and 8B are diagrams illustrating another example of the power transmission switching mechanism of the lifting mechanism 30 according to one embodiment.

In this example, upper units 20*a* and 20*b* are stacked. The upper units 20*a* and 20*b* are examples of units, and the units may include the upper units 20*a* and 20*b* and the device 70.

In the example in FIG. 8A, a unit-side groove 40*b* is provided on a side surface of the upper unit 20*b*, and a unit-side groove 40*c* is provided on a side surface of the upper unit 20*a*. A lifting mechanism-side groove 31*a* is provided on a side surface of the lifting mechanism 30 so as to be paired with any one of the unit-side grooves 40b and 40c.

The lifting mechanism 30 is raised or lowered such that the lifting mechanism-side groove 31a is positioned facing a given one among the unit-side grooves 40b and 40c. Subsequently, the lifting mechanism 30 is stopped at a position at which a height of the given one groove among the unit-side grooves 40b and 40c is the same as a height of the lifting mechanism-side groove 31a. A given shaft among the two key shafts of the fixing member 50 is inserted into a space formed by the given one groove among the unit-side grooves 40b and 40c and the lifting mechanism-side groove 31a facing the given one groove. With this arrangement, the lifting mechanism 30 can transmit power to the upper unit 20a or the upper unit 20b. In such a manner, positions of the lifting mechanism 30 can be simply changed in order to raise or lower any one among the upper units 20a and 20b.

In the example of FIG. 8B, the lifting mechanism 30 includes lifting mechanism-side grooves 31a1 and 31a2. In this example, the unit-side grooves 40b and 40c respectively face lifting mechanism-side grooves 31a1 and 31a2, and subsequently a given key shaft of the fixing member 50 can be inserted into at least one receptacle among receptacles. With this arrangement, the lifting mechanism 30 can transmit power to the upper units 20a and 20b. In the example in FIG. 8B, lifting mechanism-side grooves 31a1 and 31a2 respectively face the unit-side grooves 40b and 40c, and thus at least one key shaft can be inserted into a given receptacle, without raising and lowering the lifting mechanism 30. For example, a given key shaft may be inserted into a receptacle formed by the unit-side groove 40b and the lifting mechanism-side groove 31a1, or may be inserted into a receptacle formed by the unit-side groove 40c and the lifting mechanism-side groove 31a2. Alternatively, key shafts may be respectively inserted into two receptacles as described above.

In the substrate processing apparatus 1 according to the present embodiment, with use of the power transmission switching mechanism of the lifting mechanism 30 in the configuration described above, the above-mentioned units need not to be fastened to the lifting mechanism 30 with screws, thereby increasing workability greatly. Therefore, maintenance of the chamber 10 can be performed safely and simply. Further, in the power transmission switching mechanism of the lifting mechanism 30 illustrated in the example in FIG. 8B, because the lifting mechanism-side grooves 31a1 and 31a2 are not respectively positioned with respect to the unit-side grooves 40b and 40c, maintenance of the chamber 10 can be performed more safely, simply, and efficiently.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The substrate processing apparatus in the present disclosure is applicable to any type selected from among an atomic layer deposition (ALD) apparatus, a capacitively coupled plasma (CCP), an inductively coupled plasma (ICP), a radial line slot antenna (RLSA), an electron cyclotron resonance plasma (ECR), and a helicon wave plasma (HWP).

The substrate processing apparatus may be a plasma processing apparatus. Alternatively, the substrate processing apparatus may be a processing apparatus without using a plasma as long as it is an apparatus in which a predetermined process (e.g., a deposition apparatus or an etching processing apparatus) is performed with respect to a substrate.

According to one aspect of the present disclosure, maintenance of a chamber can be performed safely and simply.

What is claimed is:

1. A substrate processing apparatus comprising:
   a chamber;
   units disposed above or on the chamber, at least one unit including a first groove; and
   a lifting mechanism including at least one second groove, the lifting mechanism being configured to raise and lower each of the units,
   wherein the units are configured to be raised and lowered in a state of being secured to the lifting mechanism, upon occurrence of a condition in which a fixing member is inserted into the first groove of the at least one unit and the second groove of the lifting mechanism.

2. The substrate processing apparatus according to claim 1, wherein the first groove and the second groove face each other to constitute a receptacle for the fixing member.

3. The substrate processing apparatus according to claim 2, wherein a cross-sectional shape of the receptacle for the fixing member is a diamond shape.

4. The substrate processing apparatus according to claim 2, wherein a cross-sectional shape of the receptacle for the fixing member is a circular shape.

5. The substrate processing apparatus according to claim 1, wherein the lifting mechanism includes second grooves, and
   wherein the at least one first groove and at least one among the second grooves face each other.

6. The substrate processing apparatus according to claim 1, wherein the lifting mechanism is configured to be driven manually.

7. The substrate processing apparatus according to claim 1, wherein the units include at least two selected from among (i) a plurality of upper units, (ii) a matching device, (iii) an antenna, and (iv) a coupling member.

8. The substrate processing apparatus according to claim 7, wherein the coupling member includes a mechanism for vertically tightening at least one among the first groove and the second groove.

9. The substrate processing apparatus according to claim 1, wherein the lifting mechanism is removably fixed to the substrate processing apparatus.

10. The substrate processing apparatus according to claim 1, further comprising an attachment portion provided on an outer wall of the substrate processing apparatus,
    wherein the lifting mechanism is configured to be attached to the attachment portion to slide with respect to the attachment portion.

11. The substrate processing apparatus according to claim 10, further comprising a receptacle for the fixing member,
    wherein the lifting mechanism is configured to transmit power to the units upon occurrence of a condition in which the fixing member is inserted into the receptacle by using the first groove and the second groove.

12. The substrate processing apparatus according to claim 1, wherein the first groove and the second groove are arranged to be line-symmetric.

\* \* \* \* \*